PHOTOELECTROSOLOGRAPHY

Filed June 1, 1965

INVENTOR
WILLIAM L. GOFFE

BY James J. Ralabate
Charles M. Brebenholt

ATTORNEYS

United States Patent Office 3,520,681
Patented July 14, 1970

3,520,681
PHOTOELECTROSOLOGRAPHY
William L. Goffe, Webster, N.Y., assignor to Xerox Corporation, Rochester, N.Y., a corporation of New York
Continuation-in-part of application Ser. No. 403,002, Oct. 12, 1964. This application June 1, 1965, Ser. No. 460,377
Int. Cl. G03g *13/00, 13/22, 5/02*
U.S. Cl. 96—1 35 Claims

ABSTRACT OF THE DISCLOSURE

An imaging member comprising a photosensitive microscopically discontinuous layer contacting a solvent soluble electrically insulating layer overlying a substrate, said microscopically discontinuous layer spaced apart from said substrate; is electrically charged, exposed to an image pattern of actinic radiation and contacted with a solvent for said solvent soluble electrically insulating layer to form an imagewise pattern of material from said microscopically discontinuous layer on said substrate.

This application is a continuation-in-part of U.S. patent application Ser. No. 403,002, filed Oct. 12, 1964 and now abandoned.

This invention relates to a novel method for image formation.

A great many methods are known for forming a visible, palpable image in response to a pattern of light and shadow. The most common of these are chemical methods wherein the color of a light sensitive chemical is changed by the action of light. Ordinary photography and blueprinting are examples of this. Other chemical methods are known in which light is used to alter the hardness, tackiness, solvent resistance, or ink receptivity of a suitable material. Such methods are widely used in the graphic arts and the electronic industries. Other methods have come into use in recent years which rely on the electrical properties of photoconductive materials rather than on chemical properties. A layer of such material is exposed to a pattern of light and shadow and the resulting electrical conductivity pattern is used to control the selective attraction or repulsion of some form of marking material to the photoconductive layer. Methods are also known in which the conductivity pattern is used to control electrochemical reactions or to create geometric changes at an interface.

The present invention falls in none of the above categories. In accordance with the present invention, the novel imaging member comprises a thin layer of photosensitive material coated over a layer of soluble or softenable material which in turn is coated on a stable mechanical support. In accordance with one embodiment of the present invention, the imaging member is exposed to a pattern of light and shadow and the underlying layer is washed away, whereupon the photosensitive material is selectively washed away in unexposed areas and adhered to the stable support in image configuration in exposed areas. The pattern of remaining photosensitive material constitutes the image. The invention has been termed photoelectrosolography because it is based on photoelectric principles and materials, and because the image is normally developed or made visible by a dissolving operation.

It is accordingly an object of the invention to provide a novel image reproduction method. Controlled particle mobilization is also an object of the invention.

It is a further object of the invention to provide a novel image reproduction method wherein a photosensitive layer is selectively washed away in image configuration.

It is a further object of this invention to provide a novel image reproduction method wherein a photosensitive layer is selectively displaced in image configuration.

It is a further object of the invention to provide a novel imaging material.

It is a further object of the invention to provide a novel imaging material in which a thin surface layer of photosensitive material is separated from a supporting element by a layer of soluble or meltable electrically insulating material.

It is a further object of the invention to provide a novel form of image.

It is still a further object of the invention to provide a novel form of image comprising a pattern of photoconductive particles.

The invention has further objects which will become apparent in the following description and claims.

Figure 1:
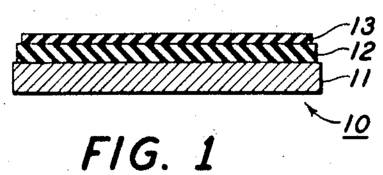
FIG. 1 is a cross section of an imaging member of the present invention.

The invention will first be described in connection with the drawing in terms of its preferred embodiment.

FIG. 1 shows the basic photosensitive element 10 which may also be called a "plate" in accordance with photographic or xerographic terminology. Plate 10 includes a support member 11 which is normally an electrical conductor. However, procedures adapted from the xerographic art permit the use of non-conductive substances as well. Support 11 may conveniently be a metallic sheet, web, foil, cylinder or the like, or a sheet of glass with an electrically conductive coating, preferably transparent, or a conductively coated sheet of paper or stable plastic such as polyethylene terephthalate. Coated over support 11 is a thin layer 12 of soluble highly insulating plastic. Coated over soluble layer 12 is a thin layer 13 of photoconductive material which is preferably not completely mechanically coherent.

For purposes of illustrating and describing the present invention, it is assumed that layer 12 comprises Staybelite Ester 10, a 50 percent hydrogenated glycerol rosin ester of the Hercules Powder Company, two microns in thickness, and that layer 13 comprises 0.2 micron of vapor deposited selenium.

Figure 2:
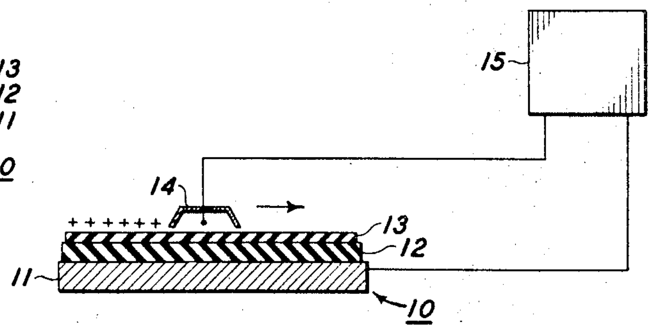
FIG. 2 is a schematic illustration of the electrostatic charging of the imaging member of FIG. 1.

The first step in carrying out the invention is to electrically charge plate 10 in darkness. This can be done by any known method, including those used in the art of xerography. A particularly useful method is shown in FIG. 2 where a corona discharge device is shown being passed across the surface of plate 10. A power supply 15 supplies a high potential in the order of 6,000 to 10,000 volts to the corona device. Illustratively, a potential of about 60–100 volts will be applied to layer 13 of selenium overlying layer 12 of Staybelite.

If a plate having a non-conductive substrate is used, it may be placed in temporary contact with a conductive member for charging by the illustrated method. Alternatively, other methods known in the art of xerography for charging xerographic plates having insulating backings may be applied. For example, plate 10 may be moved between two corona discharge devices raised to opposite potentials to cause the desired charging to be effected.

Figure 3:
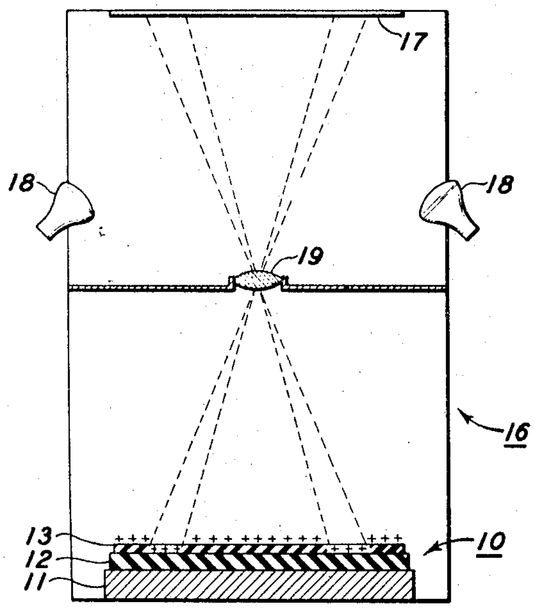
FIG. 3 is a schematic representation of the exposure step.

The next step is to expose plate 10 to a pattern of light and shadow. This may be done in a camera as shown in FIG. 3. Exposure times are comparable to those employed in xerography to discharge thick photoconductive layers. Camera 16 includes an original subject 17 which is illuminated by lamps 18 and projected by a lens 19 onto plate 10. Other forms of cameras, including snapshot cameras, may be employed. Other techniques, such as contact exposure, may also be employed. Lamps 18 or their equivalent should supply light or other radiation of wavelength to which layer 13 is sensitive, which is hereby defined as actinic radiation. Ordinary incandescent lamps can be used with almost any photoconductor, for example, as can X-rays or beams of charged particles.

For purposes of illustration, the surface electrical charges are depicted as having moved into photosensitive layer 13 in the illuminated areas. Although this representation is speculative, it is helpful for an understanding of the present invention to consider the electrical charges to be more firmly bound to illuminated areas of layer 13 as a result of the exposure step.

Image development in accordance with the present invention comprises softening plastic layer 12 through the application of heat or a solvent to permit selective migration of the photosensitive material to form an image on the surface of the plate substrate in accordance with the light pattern to which the charged plate has been exposed.

Figure 4:
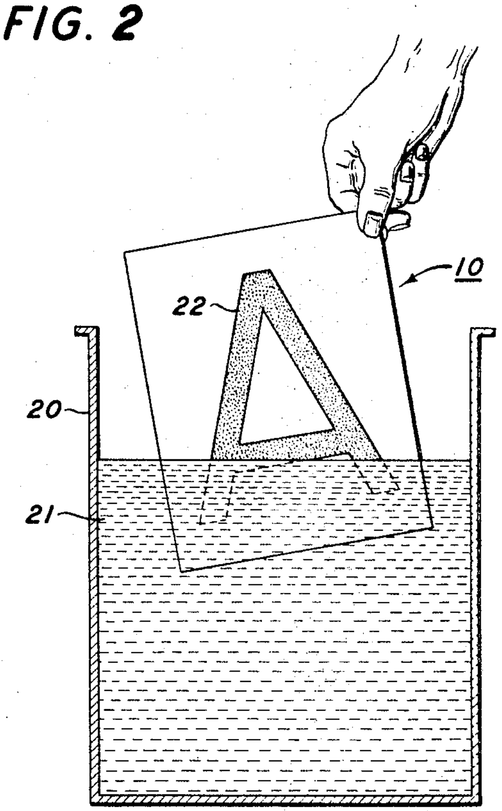
FIG. 4 is a perspective view of the development step.
Figure 5:
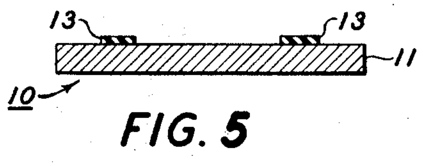
FIG. 5 is a cross section of the structure of FIG. 1 after development.

As shown in FIG. 4, the preferred method of image development comprises immersing plate 10 in container 20 containing a liquid solvent 21 for layer 12. The effect of the solvent in areas not previously exposed is to dissolve layer 12 and cause layer 13 to wash away. In exposed areas, however, layer 13 does not wash away but adheres to support layer 11 which can be withdrawn from container 20 with an image pattern 22 adhering thereon. The developed image is schematically shown in FIG. 5. The entire development process generally takes less than a second and yields images exhibiting both excellent continuous tone reproduction as well as resolution in excess of 200 line pairs per millimeter. As long as the solvent does not dissolve the photosensitve particles, plate 10 may be immersed in solvent for an indefinite time without any effect on image quality. Thus, development time is not at all critical.

Adherence of illuminated areas of layer 13 to support 11 may also be effected by applying solvent vapor to the exposed plate to soften layer 12. Similar results are obtained by softening layer 12 with heat. Although layer 12 and nonilluminated areas of layer 13 are not thereby washed away, the image produced may be viewed by means of special display techniques, including, for example, focusing light reflected from the plate onto a viewing screen. Moreover, a liquid solvent may at time thereafter be applied to the vapor or heat treated plate, and a developed image will appear as shown in FIG. 5. In this regard, it is further noted that the liquid solvent applied to a vapor or heat treated plate need not be insulating; conductive liquids may be used.

It has also been found that the non-illuminated areas of layer 13 of a vapor or heat treated plate may be removed by abrasion to yield a readily visible image, or the non-illuminated areas may be adhesively stripped off to yield complementary positive and negative images.

The mechanism of this and other embodiments of the invention is not fully understood. It is believed that application of a liquid solvent to unexposed areas simply dissolves layer 12 and causes the thin photoconductive layer 13, which is thus deprived of any mechanical support, to break up into small micron-sized or sub-micron-sized particles and washed away in the solvent. In illuminated areas, however, it appears that the presence of more firmly bound charge causes selective particle migration through the soluble layer 12 to support 11 as soon as layer 12 is softened. Once the small photoconductor particles reach the support 11, they are apparently held there by surface forces and/or electrostatic forces and tenaciously resist being washed away by the solvent. In non-illuminated areas, on the other hand, it is believed that photosensitive material is washed away before it has a chance to come into intimate contact with the support 11.

Layer 13 must permit the applied solvent to get to layer 12 in order to dissolve it. Ordinarily, no difficulty is experienced in this regard with films of sub-micron thickness. Moreover, layer 13 should not have a great degree of mechanical coherence, so that it may break up into fine particles when the underlying soluble layer is washed away.

Layer 13 of plate 10 must comprise material that is electrostatically chargeable in darkness and photosensitive in the sense that, when charged in accordance herewith, it responds to actinic radiation whereby it will rapidly migrate to the substrate upon softening of layer 12. Vitreous selenium and other photoconductors and photosensitive dyes and pigments may be used. These include for example: azo dyes, such as Watchung Red (E. I. du Pont de Nemours & Co., Inc.) quinacridones, such as Monastral Red B (E. I. du Pont); commercial indigo (National Analine Division of Allied Chemical Company); cadmium yellows, such as Lemon Cadmium Yellow X–2273 (Imperial Color and Chemical Dept. of Hercules Powder Co.) and cadmium sulfide (General Electric Company); phthalocyanine;

N-2″-pyridyl - 8,13 - dioxodinaphtho - (1,2-2′,3′)-furan-6-carboxamide (prepared in accordance with patent application Ser. No. 421,281 now Weinberger Pat. 3,447,922);

1-cyano - 2,3 - (3′ - nitro)-phthaloyl - 7,8 - benzopyrrocoline (prepared in accordance with patent application Ser. No. 445,235 now Weinberger Pat. 3,402,177);

1 - cyano - 2,3 - (3′ - acetoamido) - phthaloyl-7,8-benzopyrrocoline (prepared in accordance with patent application Ser. No. 445,235 now Weinberger Pat. 3,402,-177);

N - 2″ - pyrimidyl - 8,13 - dioxodinaphtho - (1,2-2′,3′)-furar - 6 - carboxamido (prepared in accordance with patent application Ser. No. 421,281 now Weinberger Pat. 3,447,922);

selenium-tellurium alloys;

quinacridonequinone (E. I. du Pont de Nemours & Co., Inc.) polyvinyl carbazole;

and mixtures thereof. This listing is intended to be representative; other suitable materials having the aforementioned properties may also be used.

Where layer 13 comprises selenium, suitable method of deposition is inert gas deposition as more fully described in copending U.S. patent application Ser. No. 423,167 filed Jan. 4, 1965 and now abandoned. Vacuum evaporation methods may also be used, preferably wherein the selenium is deposited at the rate of about 0.5 micron per hour onto a substrate held at approximately 65° C. A vacuum on the order of the $10^{-4}$ to $10^{-5}$ torr is suitable, and the selenium should be of a highly purified grade such as is sold for xerographic plate making purposes. It appears, however, that the purity of the selenium is less critical in the present invention than it is for making the conventional type of xerographic plates. Substrate temperatures and evaporation rate appear, however, to be relatively critical in order to obtain the desired type of deposit wherein the selenium is in the form of discrete particles.

Suitable selenium films, when viewed under the microscope, show either a network of cracks or apertures or else a network of dark lines which are apparently indicative of lines of mechanical weakness. Electron micrographs show that especially suitable selenium films are actually composed of discrete spherical amorphous particles.

Layer 13 need not be evaporated film, but may instead be formed as a layer of separate fine particles by any known technique. For example, photosensitive particles may be ground up and dusted onto substrate 12. Or, fine photosensitive particles may be mixed with large granules of the type known as exerographic carrier and poured or cascaded over the surface of layer 12.

Photosensitive microscopically discontinous layer as used herein refers to any layer 13 and specifically all the layer 13 forms disclosed herein, including those layers comprising discrete particles and those comprising apparently more mechanically continuous layers with a microscopic network of lines of mechanical weakness or which are otherwise fracturable and not completely mechanically coherent in the process hereof, which in the imaging member configurations hereof and their equivalents; in response to electrical charging, imagewise exposure to actinic radiation and solvent contact are caused to selectively deposit in image configuration on a substrate.

Layer 12 should be formed of a material with a high electrical resistivity such that it is capable of retaining a surface electrostatic charge and capable of retaining a high resistivity even as it is being softened by a solvent or by heat. Layer 12 may be applied to the support 11 by various means. Roll coating from a solvent solution is a preferred method, but any method of forming a thin, smooth film is satisfactory. In addition to the above-mentioned materials, thermoplastic-type materials used in connection with imaging methods wherein a film is electrostatically deformed, are also generally suitable. Representative of suitable materials are: Piccotex 100, a styrene type resin made by Pennsylvania Industrial Chemical Company; Araldite 6060 and 6071 epoxy resins made by Ciba; Velsicol X-37 (Velsicol Chemical Corp.)

The thickness of layer 12 is not extremely critical. However, as the required charging voltage is greater, thicker layers are less desirable from the standpoint of employing the process with equipment of minimum cost and complexity. On the other hand, extremely thin layers are difficult to form with a suitable degree of uniformity. Two microns has proven to be a generally suitable thickness for layer 12.

As described previously, the solvent used should be a solvent for layer 12 but not for layer 13. It should have high enough electrical resistance to prevent the photosensitive particles from losing their charge before they can reach support 11. Other properties such as cost, volatility, odor toxicity, and flammability will affect the selection of solvent but do not directly affect the carrying out of the invention. Suitable solvents include, for example: cyclohexane, pentane, heptane, toluene, trichloroethylene, and the like. It is also desirable to include a small amount of soluble film-forming material in the solvent to conveniently fix the photosensitive particles to the support after development. Most conveniently, the film-forming material will simply be a small amount of the material comprising soluble layer 12.

The magnitude of the electrostatic charge applied in accordance with the present invention should generally be within the range of about 20–120 volts. This range applies to plates having softenable layers of the preferred thickness (approximately 2 microns), and, as already indicated, the charge applied to thicker layers should be greater. If plate 10 is charged to a higher potential than that indicated, the photosensitive materials will adhere to the substrate generally, rather than selectively, upon solvent development.

The following specific examples are presented in terms of specific materials and process parameters to more fully explain the present invention but are not intended as limitations thereof.

EXAMPLE I

A plate 10, as illustrated in FIG. 1, is prepared by roll coating a 2 micron layer 12 of Staybelite Ester 10 (Hercules Powder Company) on Mylar polyester film (E. I. du Pont de Nemours Co., Inc.) having a thin transparent aluminum coating. A layer of selenium, approximately 0.2 micron in thickness, is then deposited on layer 12 by the inert gas deposition process of patent application Ser. No. 423,167.

Plate 10 is then electrostatically charged in darkness to a positive potential of about 60 volts by means of a corona discharge device (FIG. 2). The charged plate is exposed to an optical image with energy in illuminated areas of 1.51×10″ photons/cm. by means of a 4000 angstrom unit light source, and then immersed in cyclohexane for about 2 seconds and removed. A faithful replica of the optical image is thereby produced.

EXAMPLE II

A plate 10 is prepared by vacuum evaporating a 0.2 micron layer of amorphous selenium on a 2 micron layer of Piccotex 100 (Pennsylvania Industrial Chemical Company) overlying aluminized Mylar. The plate is then charged by rolling it against a brass plate covered with a layer of Dow Corning 200 silicone fluid, .65 centistoke grade, with a voltage applied between plate 10 and the brass plate to electrostatically charge plate 10 to about 40 volts. The plate is then exposed and developed as in Example I.

EXAMPLE III

A plate 10 is prepared by vacuum evaporating a 0.2 micron layer of commercial indigo (National Analine Co.) on a 2 micron layer of Staybelite 10 overlying aluminized Mylar. The plate is then charged, exposed and developed in accordance with Example I.

EXAMPLE IV

Polyvinyl carbazole is ground to a particle size of about 10 microns and mixed with xerographic carrier material (Xerox Corporation). The mixture is cascaded several times across the surface of a 3 micron layer of Staybelite 10 overlying aluminized Mylar, thereby forming a plate 10 which is then processed in accordance with Example I to produce a viewable image.

EXAMPLE V

Watchung Red B (E. I. du Pont de Nemours Co., Inc.) having a particle size of approximately two microns is cascaded across the surface of a 2 micron Staybelite Ester 10 layer overlying aluminized Mylar. The plate 10 thereby formed is electrostatically charged to a potential of about −30 volts by means of a corona discharge device, and the charged plate exposed to an optical image of about 200 foot-candle-seconds in illuminated areas by means of a microscope lamp equipped with a 22 watt tungsten lamp and a weak blue filter. The plate is developed by immersion in Freon 113, a fluorinated hydrocarbon (E. I. du Pont de Nemours Co., Inc.) for about 1 second and then removed.

EXAMPLES VI–XI

Example V is carired out with one of the following materials in place of Watchung Red B, with the corresponding charging and exposure values:

| Material | Applied potential (volts) | Exposure (ft.-candle-sec.) |
|---|---|---|
| Monastral Red B (E.I. Du Pont) | −120 | 180 |
| Commercial indigo | −60 | 290 |
| Cadmium Yellow X-2273 (Hercules Powder Co.) | +20 | 400 |
| Cadmium sulfide (General Electric Company) | −20 | 400 |
| N-2″-pyridyl-8, 13-dioxodinaphtho-(1, 2-2′, 3′)-furan-6-carboxamide | −30 | 300 |
| 1-cyano-2, 3-(3′-nitro)-phthaloyl-7, 8-benzo-pyrrocoline | −30 | 300 |

EXAMPLE XII

Example I is carried out as described except that plate 10 is electrostatically charged to a negative potential of about 50 volts.

EXAMPLE XIII

The steps of Example II are carried out except that the plate is simultaneously charged and exposed to an optical image through the transparent substrate.

The foregoing description being for illustrative purposes only, there is no intention to limit the invention otherwise than in accordance with the following claims.

What is claimed is:

1. An imaging method comprising of the steps of:
(a) providing an imaging member comprising a photosensitive microscopically discontinuous layer contacting a solvent soluble electrically insulating layer overlying a substrate, said photosensitive microscopically discontinuous layer spaced apart from said substrate;
(b) electrically charging said member;
(c) exposing said member to an image pattern of actinic radiation; and
(d) applying a solvent for said electrically insulating layer to said member wherein said solvent is sufficiently electrically insulating to prevent said photosensitive microscopically discontinuous material from losing its charge before reaching said substrate and wherein said photosensitive microscopically discontinuous material and said substrate are not entirely soluble in said solvent, whereby said electrically insulating layer and selective portions of said photosensitive microscopically discontinuous layer are substantially removed and whereby selective other portions of said photosensitive microscopically discontinuous layer are deposited on said substrate in image configuration.

2. An imaging method according to claim 1 wherein said charging and said exposing are carried out substantially simultaneously.

3. An imaging method according to claim 1 wherein said substrate is electrically conductive.

4. An imaging method according to claim 3 wherein said substrate comprises a conductively layered electrically insulating substrate layer.

5. An imaging method according to claim 4 wherein said conductive layer is at least partially transparent.

6. An imaging method according to claim 4 wherein said electrically insulating substrate layer is a stable plastic.

7. An imaging method according to claim 6 wherein said stable plastic comprises polyethylene terephthalate and said conductive layer comprises aluminum.

8. An imaging method according to claim 1 wherein said member is electrically charged to a potential below the threshold at which the photosensitive microscopically discontinuous layer will adhere to the substrate when immersed in solvent.

9. An imaging method according to claim 1 wherein said photosensitive microscopically discontinuous layer comprises a photoconductor.

10. An imaging method according to claim 9 wherein said photoconductor comprises a phthalocyanine.

11. An imaging method according to claim 9 wherein said photoconductor comprises selenium.

12. An imaging method according to claim 11 wherein said selenium comprises amorphous selenium.

13. An imaging method according to claim 12 wherein said photosensitive microscopically discontinuous layer is less than about one micron in thickness.

14. An imaging method according to claim 12 wherein said microscopically discontinuous layer comprises discrete particles comprising amorphous selenium.

15. An imaging method according to claim 14 wherein said discrete particles are submicron in size.

16. An imaging method according to claim 1 wherein said exposing is at least partially accomplished from the substrate side through the substrate which is at least partially transparent to said actinic exposing radiation.

17. An imaging method according to claim 16 wherein said substrate is electrically conductive.

18. An imaging method according to claim 16 wherein said substrate comprises a conductive layer, at least partially transparent to actinic exposing radiation, overlying an electrically insulating substrate layer at least partially transparent to actinic exposing radiation.

19. An imaging method according to claim 18 wherein said electrically insulating substrate layer comprises a stable plastic and said transparent conductive layer comprises aluminum.

20. An imaging method according to claim 1 wherein said member is at least partially electrically charged by corona discharge from an adjacent corona discharge device.

21. An imaging method according to claim 20 wherein said substrate is electrically conductive and the corona charging is at least partly accomplished with the substrate electrically grounded.

22. An imaging method according to claim 20 wherein the electrostatic field within the softenable layer as a result of electrically charging is between about six and about 60 volts/micron thickness of solvent soluble electrically insulating layer and wherein said photosensitive microscopically discontinuous layer comprises selenium.

23. An imaging method according to claim 1 wherein said solvent is applied by immersing said member in said solvent.

24. An imaging method according to claim 1 wherein said photosensitive microscopically discontinuous layer is less than about one micron in thickness.

25. An imaging method according to claim 1 wherein said solvent is selected from the group consisting of cyclohexane, pentane, heptane, toluene, trichloroethylene and mixtures thereof.

26. An imaging method according to claim 1 wherein the member is electrically charged to a potential within the range of between about 20 to about 120 volts.

27. An imaging method according to claim 1 wherein the electrostatic field within the softenable layer as a result of electrically charging is between about six and about 60 volts/micron thickness of solvent soluble electrically insulating layer.

28. An imaging method according to claim 1 wherein said member is exposed after being electrically charged.

29. An imaging method according to claim 1 wherein said microscopically discontinuous layer comprises discrete particles.

30. An imaging method according to claim 1 wherein said solvent soluble electrically insulating layer is thermoplastic.

31. An imaging method according to claim 30 wherein said solvent soluble electrically insulating layer comprises a partially hydrogenated rosin ester.

32. An imaging method according to claim 1 wherein said solvent soluble electrically insulating layer is about 2 microns thick.

33. An imaged member comprising a substrate and image areas on said substrate, said image areas consisting essentially of photoconductive particles having entire particle diameters not greater than about 1 micron, said image areas comprising photoconductive particles comprising selenium.

34. An imaged member of claim 33 wherein said photoconductive particles comprises amorphous selenium.

35. An imaged member of claim 33 wherein said image areas consist essentially of photoconductive particles comprising amorphous selenium.

(References on following page)

References Cited

UNITED STATES PATENTS

| | | | |
|---|---|---|---|
| 2,924,519 | 2/1960 | Bertelsen | 96—1.4 |
| 2,940,847 | 6/1960 | Kaprelian | 96—1 |
| 3,154,415 | 10/1964 | Kaulen | 96—38 X |
| 3,254,997 | 6/1966 | Schaffert | 96—1 |
| 3,291,601 | 12/1966 | Gaynor | 96—1.1 |

OTHER REFERENCES

McNeil et al., "Selenium Coatings in the Thickness Range 0.2 to 2.5 Microns for Xerography." J. Photographic Science, vol. 7, pp. 25–32 (1959).

GEORGE F. LESMES, Primary Examiner

C. E. VAN HORN, Assistant Examiner

U.S. Cl. X.R.

96—1.4, 1.5; 117—1.7, 17.5, 218